United States Patent
Suri et al.

(10) Patent No.: US 8,645,896 B1
(45) Date of Patent: Feb. 4, 2014

(54) METHOD TO TRANSFER FAILURE ANALYSIS-SPECIFIC DATA BETWEEN DESIGN HOUSES AND FAB'S/FA LABS

(75) Inventors: Hitesh Suri, San Jose, CA (US); Catharine L. Kardach, Saratoga, CA (US)

(73) Assignee: DCG Systems Inc, Fremont, CA (US)

( * ) Notice: Subject to any disclaimer, the term of this patent is extended or adjusted under 35 U.S.C. 154(b) by 17 days.

(21) Appl. No.: 13/232,796

(22) Filed: Sep. 14, 2011

Related U.S. Application Data

(63) Continuation-in-part of application No. 11/823,566, filed on Jun. 28, 2007, now abandoned.

(51) Int. Cl.
*G06F 17/50* (2006.01)

(52) U.S. Cl.
USPC .......................................... 716/136; 716/52

(58) Field of Classification Search
USPC ............................................. 716/52, 112, 136
See application file for complete search history.

(56) References Cited

U.S. PATENT DOCUMENTS

| | | | |
|---|---|---|---|
| 6,691,290 B1 * | 2/2004 | Wu | 716/112 |
| 7,571,422 B2 * | 8/2009 | Adel et al. | 716/51 |
| 2005/0251771 A1 * | 11/2005 | Robles | 716/5 |
| 2010/0031092 A1 * | 2/2010 | Dokken et al. | 714/45 |

* cited by examiner

*Primary Examiner* — Vuthe Siek
(74) *Attorney, Agent, or Firm* — Deborah W. Wenocur

(57) ABSTRACT

A method and system for an IC design house to transfer design and layout information to a fabrication or failure analysis facility on a need-to-know basis to enable effective failure analysis while not providing unnecessary or extraneous information.

10 Claims, 15 Drawing Sheets

```
SiGPS Query Results
├─ CELL i_so2/clkbuf (1597.130127 -1667.425049) (1600.430176 -1662.385010) BUFX4
├─ NET i_so2/clkint
├─ CELL i_so2/clkbuf (1597.130127 -1667.425049) (1600.430176 -1662.385010) BUFX4
├─ CELL i_so2/clkdiv/d1 (1635.409912 -1662.385010) (1649.269897 -1657.344971) DFFX2
├─ CELL i_so2/cntr/d9 (1581.290039 -1667.425049) (1595.150024 -1662.385010) DFFX2
├─ CELL i_so2/cntr/d8 (1587.229980 -1657.344971) (1601.089966 -1652.304932) DFFX2
├─ CELL i_so2/cntr/c1/d3 (1676.329834 -1647.265015) (1690.189819 -1642.224976) DFFX2
├─ CELL i_so2/cntr/c1/d2 (1686.229980 -1652.305054) (1700.089966 -1647.265015) DFFX2
├─ CELL i_so2/cntr/c1/d1 (1695.469971 -1657.344971) (1709.329956 -1652.304932) DFFX2
├─ CELL i_so2/cntr/c1/d0 (1682.270020 -1667.425049) (1696.130005 -1662.385010) DFFX2
├─ CELL i_so2/cntr/c2/d3 (1628.810059 -1642.224976) (1642.670044 -1637.184937) DFFX2
├─ CELL i_so2/cntr/c2/d2 (1649.270020 -1647.265015) (1663.130005 -1642.224976) DFFX2
├─ CELL i_so2/cntr/c2/d1 (1622.209961 -1647.265015) (1636.069946 -1642.224976) DFFX2
├─ CELL i_so2/cntr/c2/d0 (1652.570068 -1652.305054) (1666.430054 -1647.265015) DFFX2
├─ NET i_so2/cntr/clk
├─ CELL i_so2/cntr/c2/d3 (1628.810059 -1642.224976) (1642.670044 -1637.184937) DFFX2
├─ CELL i_so2/cntr/d8 (1587.229980 -1657.344971) (1601.089966 -1652.304932) DFFX2
├─ CELL i_so2/cntr/d9 (1581.290039 -1667.425049) (1595.150024 -1662.385010) DFFX2
├─ CELL i_so2/cntr/c1/d3 (1676.329834 -1647.265015) (1690.189819 -1642.224976) DFFX2
└─ CELL i_so2/clkbuf (1597.130127 -1667.425049) (1600.430176 -1662.385010) BUFX4
```

FIG. 3b

FA example using Laser Voltage Imaging (LVI)

- Laser Voltage Imaging can be used to isolate a broken flop (refer to DCG modulation mapping patents)
- Cells 900 are scan chain flops derived from STIL and provided by the design house
- Cell 905 highlighted in-situ at the foundry using a GDS-based cell query
- This example illustrates that the LVI signal (white spots) is degrading in flop10 (half of the spots are missing.)
- By tracing flop 10's logic path forward, through a buffer, which is also dead (no LVI activity), an area is easily defined for physical failure analysis (PFA)
- The area defining flop 10 + buffer + flop 9 (first completely dead flop) can be used as the region of interest for physical failure analysis (PFA)

FIG. 11

METHOD TO TRANSFER FAILURE ANALYSIS-SPECIFIC DATA BETWEEN DESIGN HOUSES AND FAB'S/FA LABS

CROSS REFERENCE TO RELATED APPLICATION

This application is a Continuation-in-Part of U.S. application Ser. No. 11/823,566 filed Jun. 28, 2007 now abandoned, and claims priority thereto. The specification of application Ser. No. 11/823,566 is hereby incorporated by reference in its entirety.

FIELD OF THE INVENTION

This invention is in the field of integrated circuit failure analysis, and more particularly in the field of transfer of design data between design houses and fab's or FA labs for failure analysis or circuit edit.

BACKGROUND OF THE INVENTION

In the current business environment for integrated circuit device manufacturing, an increasingly used business strategy is for the Integrated Device Manufacturers (IDM's) to go fab-lite or fab-less, and to separate the design and fabrication portions of the manufacturing by sending the fabrication portion of the jobs to dedicated fab companies such as TSMC, UMC, and Chartered.

Whereas the separation of design and fabrication tends to yield an increase in efficiency and lowering of costs, it raises some issues of concern to the manufacturers. The transfer of information between the design houses and the fabrication companies or the failure analysis labs can cause security concerns. This is particularly true when design houses need to transfer design-specific information to the fab or service houses for Failure Analysis (FA) work being done at the fab or service houses.

The basic information required by a fabrication facility in order to fabricate a design is the fabrication level GDS2 files, which show the actual layer-by-layer layout. The GDS2 files yield a local description of the layers, but do not include the descriptions of net names, cell names, or higher level connectivity. The GDS2 files are in binary format, and contain all the layout polygons and their corresponding layer information. Design level files, on the other hand, have different components, as follows:

Library Exchange Format (LEF) files contain building blocks of different Functional Units, e.g., NAND gates, in layout form, and depend on the design rules and the particular fab and technology (i.e., the LEF files are technology-specific). LEF files are normally provided by the fab for each chip. Design files created by the circuit designers are generally created in VHDL or Verilog formats—both ASCII files in high level logic-based languages. Electronic Design Automation (EDA) tools then synthesize, i.e., convert the design files to gate level Net lists in an Electronic Design Interchange Format (EDIF) file. From the EDIF file the EDA tools form Placement And Route (PAR) files which include the actual placement and routing of the Functional Units. From the PAR files, the EDA tools create the fabrication level GDS2 files, which show the actual layer-by-layer layout. The EDA tools can optionally create Design Exchange Format (DEF) files from the PAR files. The DEF files describe how the Functional Unit building blocks are placed and connected by nets, according to the circuit design and design rules. The DEF file is therefore a circuit design in layout format, and includes net connectivity and cell placement. Both the LEF file and the DEF file are in high level ASCII format.

A use of these design and fabrication files in Failure Analysis is described in commonly owned U.S. patent application Ser. No. 11/502,951, filed Aug. 11, 2006, and U.S. Pat. No. 5,675,499, issued Oct. 7, 1997, both of which are hereby incorporated by reference in their entireties. The LEF and DEF files are read by a LEF/DEF Reader, then converted into an efficient, easily accessible cross-mapping database in binary format. When queried by cell or net instance name, the database can provide locations, dimensions and polygons which represent that logical element. Conversely, when queried by physical location, the database can provide cell and/or net instance name corresponding to that location. The cross-mapping database can also be used in conjunction with GDS2 files. The GDS2 files have all the shapes that will be fabricated, in mask layout form. The user can identify these shapes from the GDS2 data. The cross-mapping database has the design element names, plus their corresponding polygons and location. As described in earlier incorporated U.S. patent application Ser. No. 11/502,951, a set of advanced algorithms known as OP3 utilize GDS2 files and the database file to determine optimal placements of probe points, net cuts, and net joins which are utilized in analysis and correction of failures. These determined placements can be indicated on the GDS2 files.

When the aforementioned strategy is used to have the fabrication and failure analysis performed in a special fab facility rather than by the design house, files and data must be transferred to the fab facility from the design facility. The GDS2 files provide the mask data, and are all that are required for the fabrication. However, for failure analysis additional information is generally required, including some cells, nets and/or connectivity data. Currently, the design houses send both the raw GDS2 files or mask data converted into a proprietary format, and additional design information, usually in ASCII format, such as the LEF/DEF, LVS, and/or schematic files. The schematic files are the actual circuit diagrams, which show the complete connectivity of the circuit design, rather than any placement data. The LVS (Layout Vs. Schematic) files check the GDS2 file to be sure it follows the schematic. The design house uses these files as inputs to a layout tool and failure analysis equipment. In this procedure, however, the transfer of the complete design files raises security concerns, and furthermore is not essential, since the FA engineers do not require the full mask data and design information for the FA job.

A method of providing to the fabrication facilities only the information required to perform effective Failure Analysis would alleviate these security concerns when using the fab-lite or fab-less IC manufacturing strategies for design houses.

SUMMARY OF THE INVENTION

It is therefore an object of this invention to provide a method and system for an IC design house to transfer design and layout information to a fabrication or failure analysis facility on a need-to-know basis to enable effective failure analysis while not providing unnecessary or extraneous information.

This object is met by the methods described herein.

BRIEF DESCRIPTION OF THE DRAWINGS

FIG. 3b shows the result of an exemplary SiGPS query to identify the net and other connected cells to the originally identified cell of FIG. 3a.

FIG. 11 describes an FA example using Laser Voltage Imaging (LVI) according to the path tracings of FIGS. 9 and 10.

DETAILED DESCRIPTION OF THE INVENTION

Figure 1:
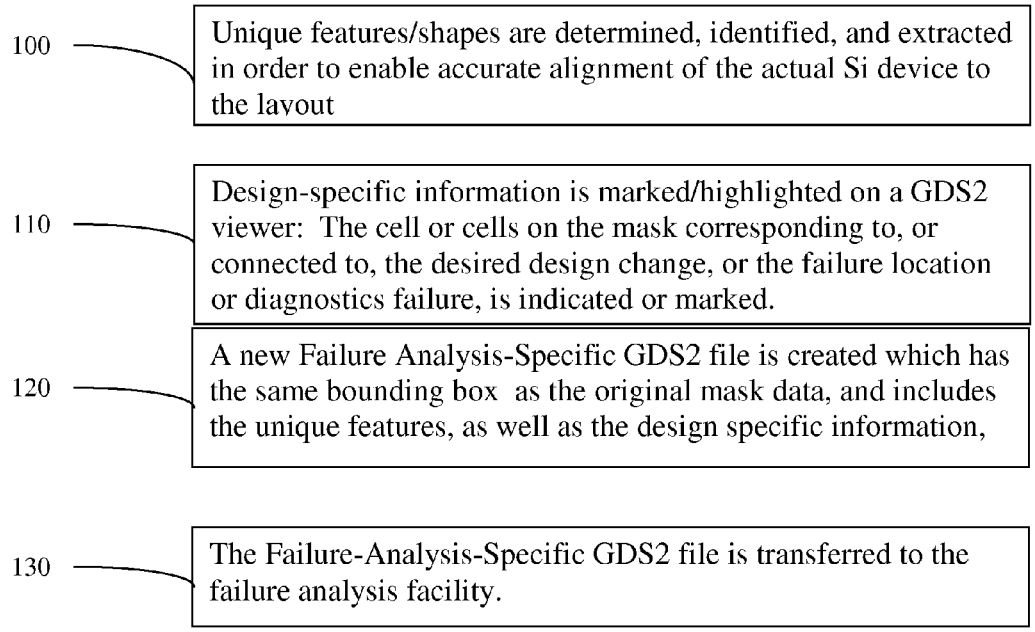
FIG. 1 is a chart indicating the steps of a first embodiment of the present invention.
Figure 2A:
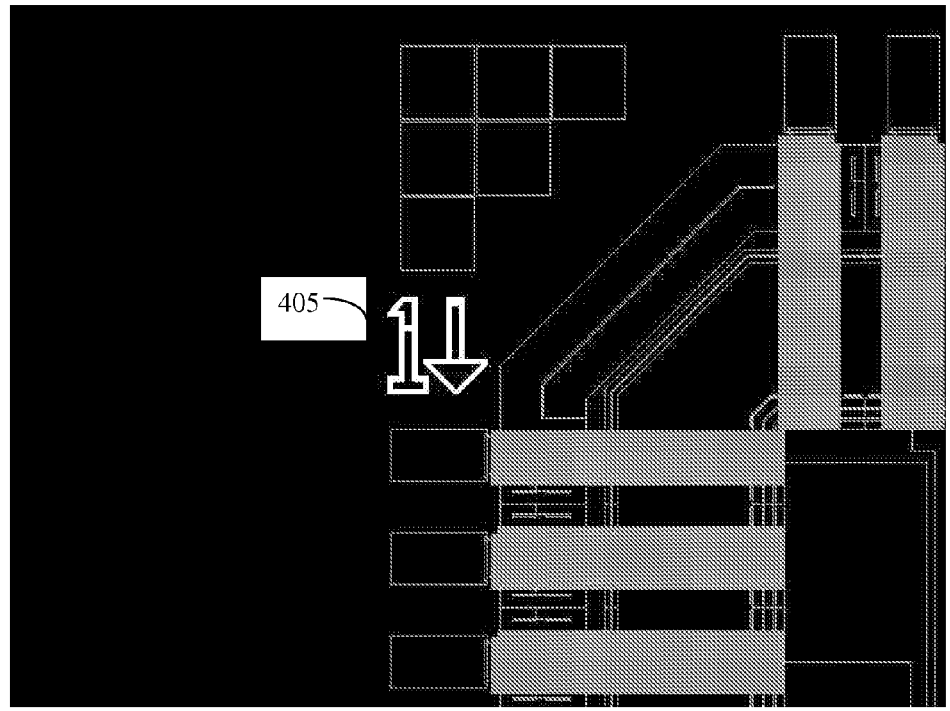
FIG. 2a shows an example of a unique feature at a first corner of a layout.
Figure 2B:
FIG. 2b shows an example of a unique feature at a second corner of a layout.
Figure 2C:
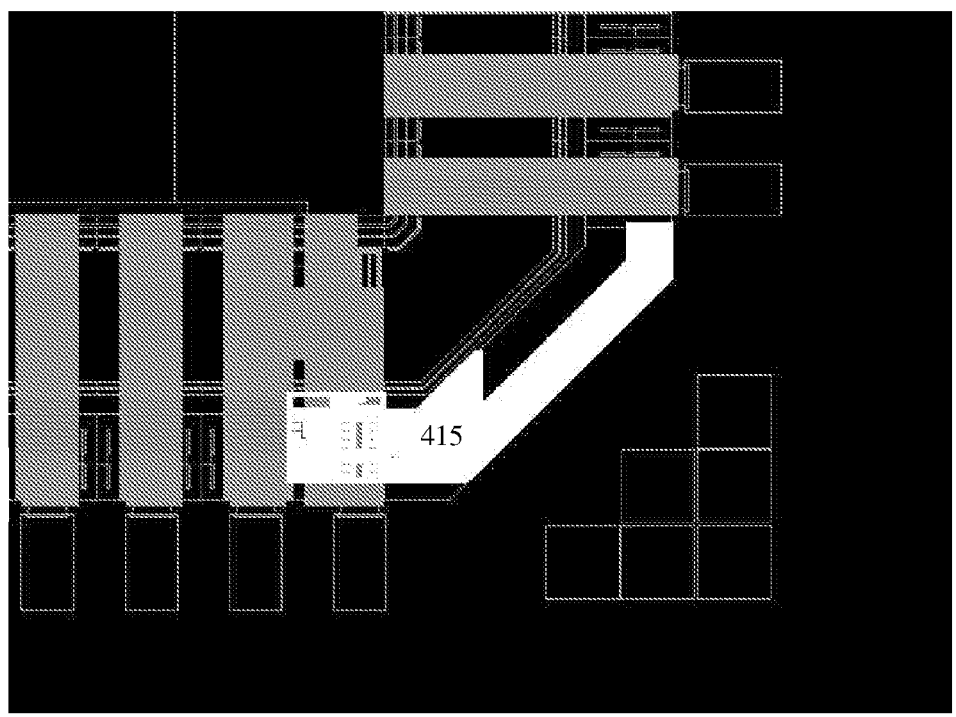
FIG. 2c shows an example of a unique feature at a third corner of a layout.
Figure 2D:
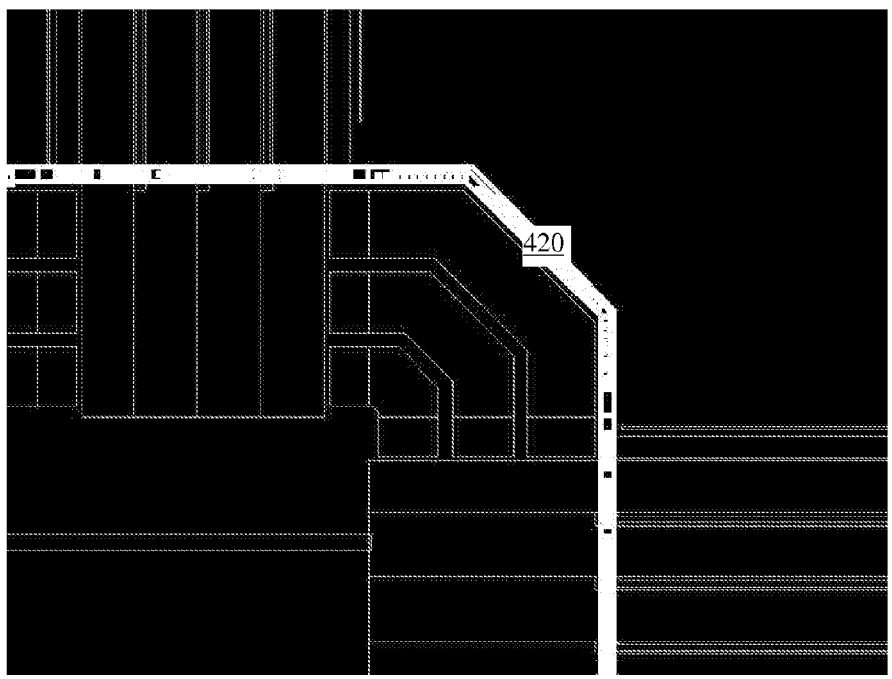
FIG. 2d shows an example of a unique feature at a fourth corner of a layout.

The present invention provides a method to transfer the necessary information (in addition to the standard GDS files) from the design house to the fab or facility which will be doing failure analysis on an IC, on a need-to-know basis so as to minimize security concerns. If the files are being transferred to a fab facility, the fab already has the GDS2 files, so they require the information additional to the GDS2. In case a Failure Analysis (FA) Service house is doing the analysis job, they don't need the standard GDS2 file, which is used for the fabrication. Only the necessary information, which may include some layout plus some design or connectivity information, can be extracted and sent over to them.

Failure analysis issues generally fall into three broad categories. The first is an actual failure of an operating circuit, often caused by a processing problem. A customer experiencing this type of failure will generally be able to indicate the location of the failure. The second type of failure analysis deals with design problems in a circuit. In this case, it is generally necessary to perform a circuit edit in a specific location, for example a net cut or a net join, in order to attempt to address the design problem. And a third type of issue is when a diagnostics failure shows up, during testing rather than during actual circuit operation. In this case, the diagnostics program will generally localize the failure to a range of cell or pin suspects. This can then be correlated with the LEF/DEF/LVS/schematic files.

The present invention extracts and transfers design information targeted towards the Failure Analysis, including the three categories described above.

The actual planning and execution of Failure analysis may consist of three separate aspects:
1) Planning of a failure analysis strategy;
2) Probing a specified region or set of connected cells to determine the exact location of a failure; and
3) Determining the exact location(s) of, and performing, one or more circuit edit operations.

In general, the design house maintains full control over strategy planning, and over the specification of locations for circuit edit once the exact failure location is determined. It also determines which cells or interconnect regions may need to be probed in order to exactly locate the fault. The fabrication facility may be responsible for doing the actual probing and providing the results to the design facility.

Probing of cells could mean probing the output pins of the cells, for example when using ATPG test results, as described hereinafter, or when using Time Resolved Emission (TRE) probing or Laser Voltage Probing (LVP). If the actual net (rather than output pins) is being probed, the design house may need to use the OP3 algorithms, described above, to specify the location on the net(s) where probe data needs to be acquired. However, if the probe data can be acquired at any location on the net, then the design house can leave the determination of the location to the FA/Fab house. Similarly, in the case of circuit edit, the design house may need to specify the cut or join edit locations on the net, or there may be circumstances when the fab/FA house can make the edit location determination.

FIG. 1 is a chart indicating the steps of a first embodiment of the present invention. FIGS. 2-4 show further details of this first embodiment.

In step 100, unique features/shapes are determined, identified, and extracted (i.e., the GDS2 file is read and the polygons are identified by the user) in order to enable accurate alignment of the actual Si device to the layout. Unique features are simply easily identifiable (by shape) features that serve as identifiers in relation to the CAD layout. In general, a separate unique feature is chosen near each of the four corners of the device layout. FIGS. 2a-2d show examples of unique features at four corners of a layout. According to the present invention, those unique features are marked or highlighted on the original mask data. This may be accomplished by extracting the polygon shapes corresponding to the unique features from the GDS2 file or proprietary mask database. A separate abbreviated GDS2 file including only the necessary information is generally sent to the fabrication facility, although there may some situations where, if the fabrication facility has a full mask set, locations of the appropriate polygons on the mask data which they already have, may be all that is required to be sent.

In step 110, design-specific information is marked/highlighted on a GDS2 viewer which has the capability to superimpose LEF/DEF and LVS data on the GDS2 file. Then the cell or cells on the mask corresponding to, or connected to, the desired design change, or the failure location or diagnostics failure, all of which will be further discussed, is indicated or marked. The correspondence between location in the design and mask data or polygons is determined by querying the LEF/DEF-based cross-mapping database, or using LVS data or Physical Net Trace data. Physical Net Tracing is used when LEF/DEF or LVS Data is not available. It uses the rules file or user-defined connection rules to see how different layers are connected. An example of a rule is that M1 connects to M2 thru VIA12. So when analyzing polygons on M1 and one comes across V12, it is deduced that M1 and V12 are connected. And when V12 polygons intersect with M2, a trace can be formed indicating that these M2 polygons are connected to the previously traced M1 polygons. The person preparing the data is generally the best judge as to which data to use, according in part to what data is available and what tools were used to identify the failures. By way of example, Automatic Test Pattern Generation (ATPG) tools such as TetraMax from Synopsys generates fault candidates in the form of cell/pin names. In that case, a LEF/DEF-derived cross-mapping database would be the best for extracting the cell locations. The above description suggests that a logical-physical crossmapping database can be created from LEF/DEF files, for use by the foundry for defect localization. If the design house is not willing to send this cross-mapping database, even in proprietary format, to the foundry, a different workflow is presented as an alternative embodiment.

Figure 3A:
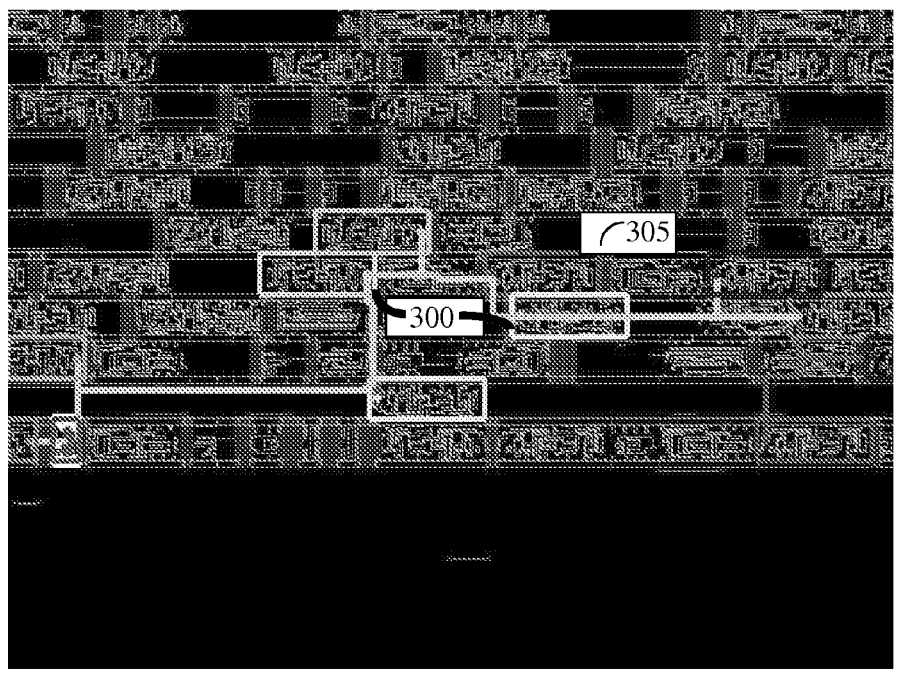
FIG. 3a shows an example of a portion of an IC, with highlighted regions indicating cells connected to a cell where a failure is detected or a design problem correction is anticipated.
Figure 4:
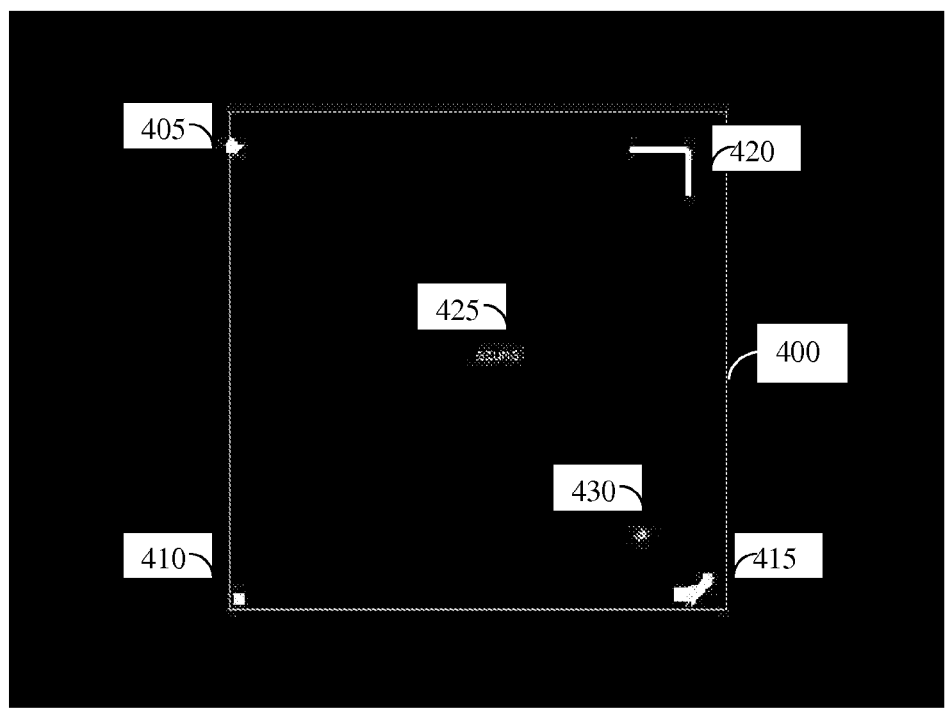
FIG. 4 illustrates an enhanced GDS2 file which has the same bounding box 400 as the original mask data, and includes the unique features as well as the design specific information.

FIG. 3a shows an example of a portion of an IC, with highlighted regions 300 indicating cells connected to cell 305, where a failure is detected or a design problem correction is anticipated. FIG. 3b shows the result of an exemplary SiGPS query to identify the net and other connected cells to the originally identified cell 305. (The SiGPS is a DCG Proprietary database which is in binary format and has been created by reading LEF/DEF files. It allows the user to query by net/cell names, and returns polygons corresponding to the cell/net). In order to determine which portions of the surrounding net or other features are pertinent to the analysis of a failure e.g., in determining which cells may need to be probed in order to exactly locate the failure, the user may take assistance from ATPG tools which simulate the faults and determine potential causes and their locations. The complete net might be sent into the enhanced GDS file, or if it is too big, the appropriate portion of the net that needs to be edited can be sent into the enhanced GDS file.

Once the problematic cell and connected net and/or cells are identified, the exact location or locations for a circuit edit, if any is required, must be determined. Again, this often involves probing of multiple cells. The determination may be made subjectively, using the experience of the user or operator. The OP3 algorithms described earlier can aid in automatic identification of preferred probe points, net cuts, and net joins.

In step 120, illustrated in FIG. 4, a new GDS2 file is created which has the same bounding box 400 as the original mask data and layout files, and includes the unique features 405, 410, 415, and 420, as well as the design specific information, for example the possible locations to do a net cut or a net join, or the nearby regions of the net (regions 425, 430) which need to be probed in order to determine the exact failure location. This new GDS file will be designated hereinafter as the FA-specific GDS file. The locations may be obtained in different ways, depending on the source of the information. For example, if a desired probing or edit location is obtained from ATPG results which pinpoint the failure to a specific pin or a specific schematic element, the locations or names from the schematic are used to query the LVS- and/or LEF/DEF-derived cross-mapping database. The results of the query are the corresponding polygons, which are then converted into GDS2 file format. The original layers can be used, or all the polygons can be treated as being on the same layer and then dumped into the correct GDS2 format. This new GDS2 file is transferred to the failure analysis facility. The failure analysis engineers use the equipment's layout tool or equipment driver tool to load the GDS2 file. The unique features 405, 410, 415, and 420 are used to do the alignment of the silicon on the equipment relative to the GDS2 file.

The above steps are followed with slightly different emphasis for three different failure analysis scenarios. These are:

1) An observed circuit failure problem;
2) A design problem; and
3) A diagnostics failure.

1. Circuit Failure Problems

Actual failures in operating circuits are generally detected and often located by the customer. Such failures are in many cases caused by processing problems such as incomplete etch, residues, etc. The location may be well-defined and localized, as when emission microscopy identifies a failure-related emission site, or it may mean an entire net if the failure is detected electrically to be a short, for example. In this case, the appropriate need-to-know information for the failure analysis is provided in the new enhanced GDS file after the customer indicates the failure location. For example, if an emission site is identified, the nets, cell instances, and vias in and around the emission site can be highlighted and exported into the GDS2. The specific information necessary to transfer depends upon how much of the failure analysis is being done by the fab house and how much by the design house. In general, the design house specifies which cells need to be probed to exactly identify and locate the failure site, but the fab or FA house may do the actual probing of several locations, which may necessitate their having the localized connectivity and/or schematic information about those cells or locations.

2. Design Problems

Design problems are generally identified by the design house, often after operational failures are seen for some or all devices using a particular design. In general, to correct a design problem, a circuit edit is necessary at a specific location or locations. The design team generally performs the edit planning, and in that case is required to determine the precise location and type of circuit edit required. To this end, once the functional location of the required edit is determined, algorithms such as the enhanced OP3 algorithms described in U.S. patent application Ser. No. 11/502,951, incorporated above, may be used to determine the optimal location of any required net cuts, net joins, or probe points to be utilized in the edit. In this case, the enhanced GDS2 file may include such features as the actual metal numbers, as well as dummy metal (either the entire layer or the dummy metal in the vicinity of the net/cell in question). Further markers may be added to facilitate performing cuts and joins. For example, text can be added into the enhanced GDS layer at appropriate locations. I.e., text could be placed at location (10, 10) saying "cut the net here" or "start the join here".

3. Diagnostic Failures

A diagnostic failure occurs when a chip is being subjected to testing as opposed to an operational failure. Methods such as Time Resolved Emission/Laser Voltage Probe (LVP) results from Automatic Test Pattern Generation (ATPG) tools are commonly used. The failures reported by ATPG tools are in the form of cell/pin names. These pin names can be queried, highlighted, and exported into the enhanced GDS file. For example, scan chains, i.e., the sequence of how the test is performed in order to put the chip into a certain state such as an error state, can be used in the probing. In this case, the FA house may get sufficient information from the ATPG tools to know where to probe to determine the type of failure and the failure site, e.g., by probing the pin outputs of a cell.

Figure 5:
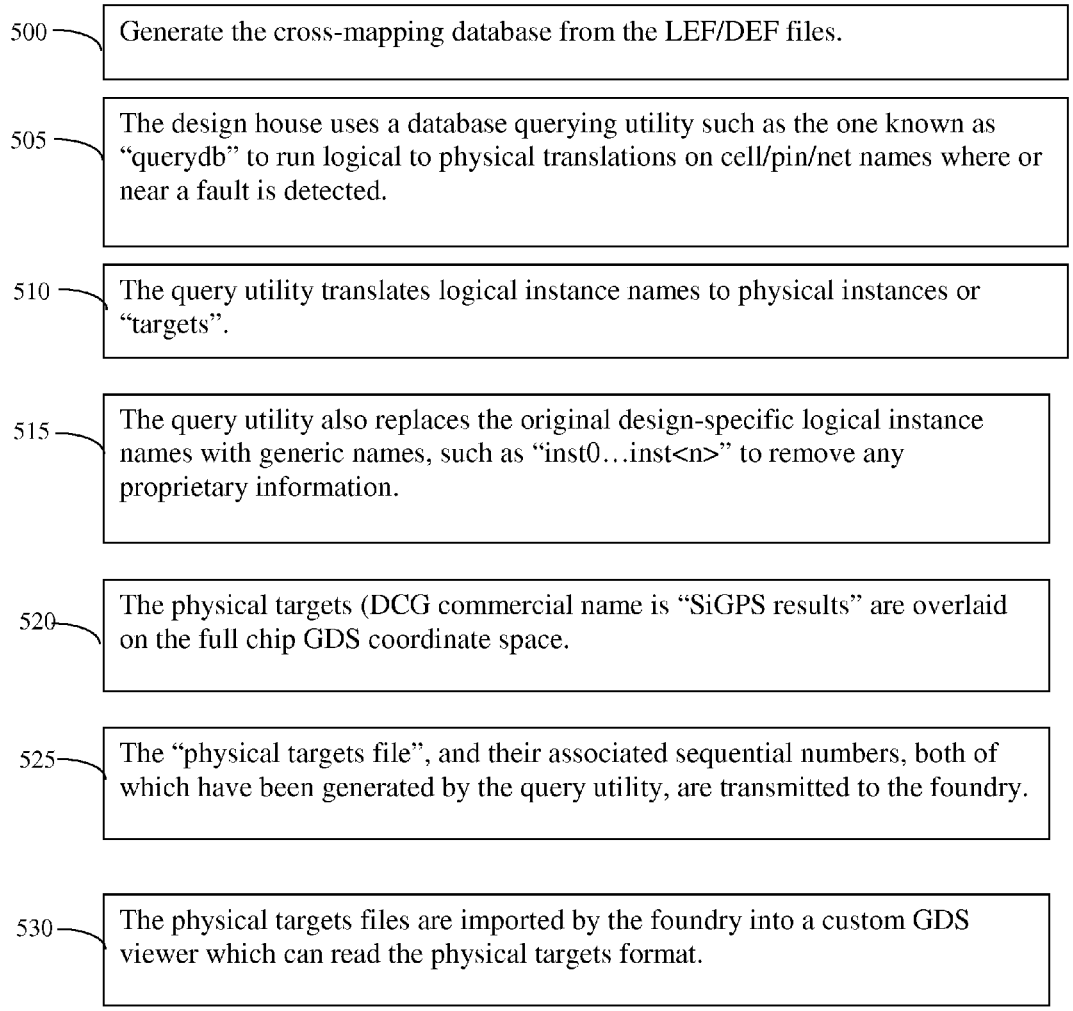
FIG. 5 is a chart indicating the design house-to-foundry process steps of a second, alternate embodiment of the invention.

FIG. 5 is a chart indicating the design house-to-foundry process steps of a second, alternate embodiment of the invention. This alternate embodiment is directed to the commonly occurring situation where the design house is not willing to send a cross-mapping database, even in proprietary format, to the foundry.

In step 500, generate the cross-mapping database from the LEF/DEF files. The LEF/DEF files and cross-mapping database remain at the design house, since the database will have design-proprietary hierarchical logical instance names embedded within it. By keeping the cross-mapping database at the design house, the foundries are not given the information to understand the hierarchy of the design, which is embedded in the hierarchical instance names. The LEF/DEF conversion to cross-mapping database can be done for DEF components only, omitting nets and special nets, which dramatically reduces conversion time for VLSI designs. For example, for a 1 billion+transistor device with a 50 GB DEF database, DEF component conversion would take less than one day, as compared to approximately 1 month when all nets were included, or approximately 1 week when all nets excluding special nets (e.g., power and ground) were included. Nets can be omitted with this technique because of the unique way that nets are traced from the LEF/DEF component pins when overlaid in the GDS, as will be described hereinafter.

In step 505, the design house uses a database querying utility such as the one known as "querydb" to run logical to physical translations on cell/pin/net names where or near a fault is detected. Input is used from a variety of sources, including but not limited to: fault diagnostic callouts from scan diagnostics, simulators, scan chain files (e.g., STIL format), and scan flop plots (from shift diagnostics).

Figure 6:
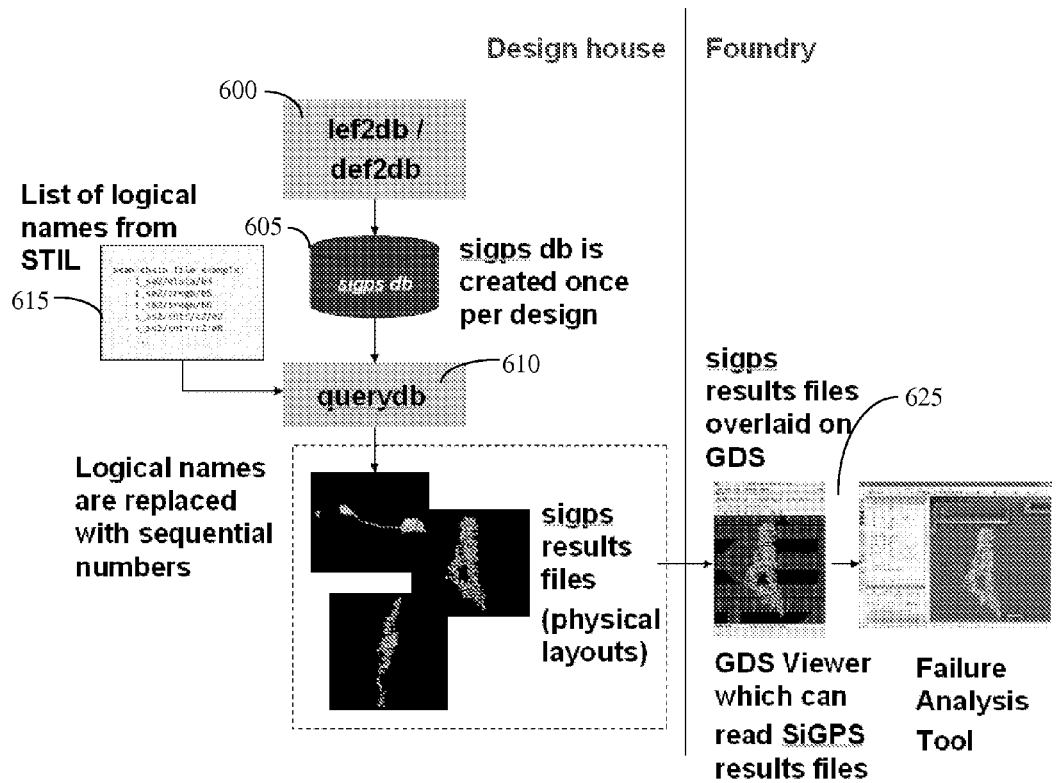
FIG. 6 illustrates an example of the use of querydb as a logical-to-physical translator applied to scan chain debug results.

FIG. 6 illustrates an example of the use of querydb as a logical-to-physical translator applied to scan chain debug results. Lef/def files 600 are converted to a cross-mapping database 605 such as SiGPS. The creation of this cross-mapping database is done once per design. The cross-mapping database is then used as input for logical-to-physical translator, or query utility ("querydb" is the DCG commercial name for the query utility) (610). In the example shown, the list of logical names to be queried is obtained as a list 615 from STIL scan chain files. In step 510, the query utility translates logical instance names to physical instances or "targets". In step 515, the query utility also replaces the original design-specific logical instance names with generic names, such as "inst0 . . . inst<n>" to remove any proprietary information. These generic names are associated with physical layouts obtained from the cross-mapping database (605)). In step 520, the physical targets (DCG commercial name is "SiGPS results" are overlaid on the full chip GDS coordinate space. If there is an offset or orientation discrepancy between the GDS for the chip and the top DEF for the chip, the query utility reads the offset, mirroring, and orientation, and applies these parameters to the physical targets file, so that overlay with the full chip GDS is accurate.

All of the preceding data is maintained at the design house. At this point, in step 525, the "physical targets file", and their associated sequential numbers, both of which have been generated by the query utility, are transmitted to the foundry. This information is overlaid on top of the foundry's pre-existing GDS2 to point out cells that could be the cause of the failure. The foundry accordingly has the physical layout information associated with likely failure sites as determined at the design house, but it has no proprietary information.

In step 530, the physical targets files are imported by the foundry into a custom GDS viewer which can read the physical targets format. The custom GDS viewer overlays the physical targets as cell/pin/net highlighting on the GDS mask data. (see 625 on FIG. 6). This overlay of physical targets on top of the GDS data is vital to the foundry-driven failure analysis described hereinafter.

In the case that the foundry or service lab does not have a custom GDS viewer capable of reading the physical targets format, the query utility can generate the physical targets in GDS format, using new mask layers for the physical target bounding boxes and pin shapes. This GDS file can be merged with the full chip GDS by the query utility, or at the foundry, using any number of off-the-shelf GDS merge utilities.

Figure 7:
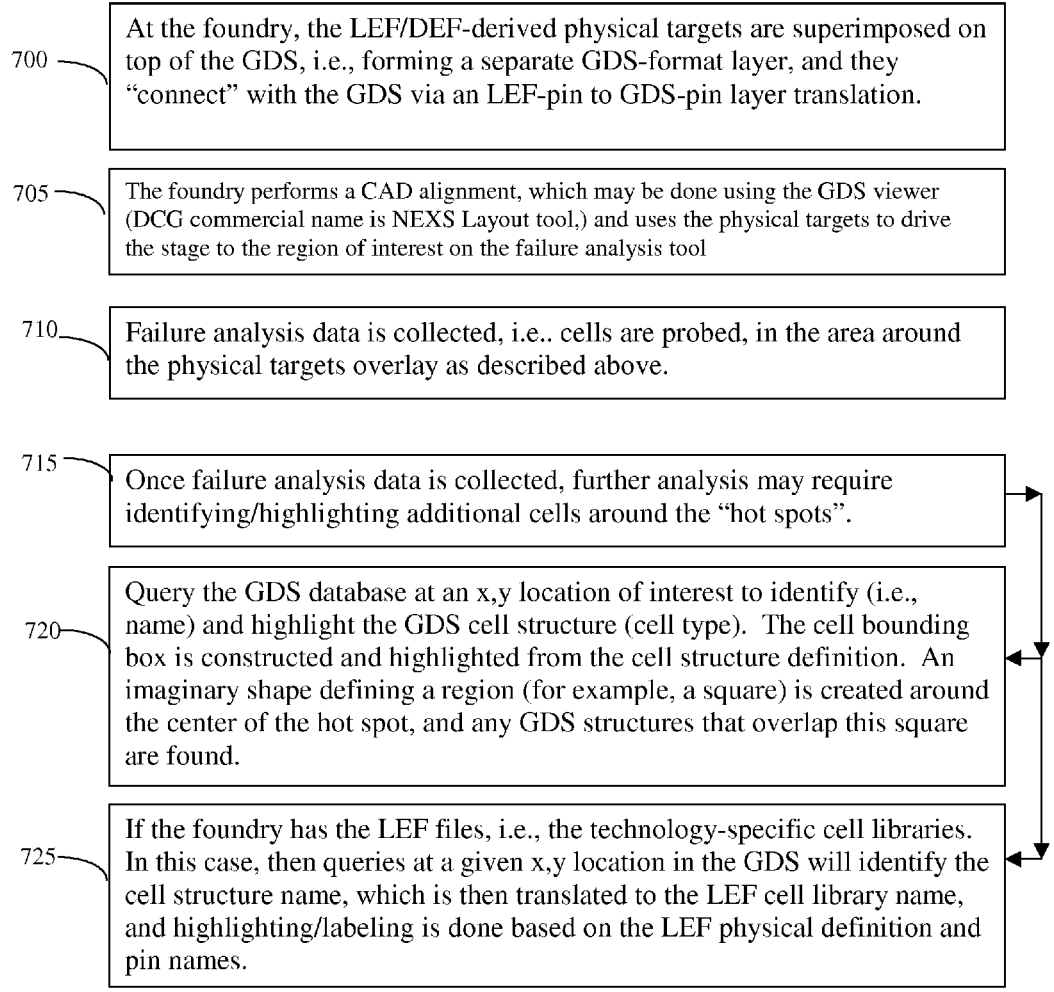
FIG. 7 is a chart indicating foundry failure analysis steps in the alternate embodiment of FIGS. 5 and 6.

FIG. 7 is a chart indicating foundry failure analysis steps in the alternate embodiment of FIGS. 5 and 6. In this embodiment, the failure analysis involves GDS-based physical net tracing from cell library pin labels. The cell pin, an entry or exit point from a cell, where input is provided or output expected from the cell, is a polygon "handle" drawn by the cell library (LEF) designer and stamped with the pin's functional label, e.g "in" or "out". This is used by auto place & route tools to understand where to make connections to cells during routing. Because LEF is generated by the place and route group and GDS is generated by the chip finishing group, there is often a mis-match between layer naming conventions. For instance, LEF pin layers might be "M1" and "M2", whereas GDS mask pin layers might be "MET1" and "MET2." Hence, the invention uses a simple translation table, e.g. "M1"="MET2", to make a connection between cell/pin overlay and GDS mask. The process of tracing nets in the GDS mask is done by defining layer connection rules, which explain how conductor layers such as POLY or METAL connect to the next higher conductor layer and through what type of intermediate layer such as CONTACT or VIA. Though physical net tracing in GDS is known, the idea of tracing GDS nets from cell library pin labels is novel.

In step 700, at the foundry, the LEF/DEF-derived physical targets are superimposed on top of the GDS, i.e., forming a separate GDS-format layer, and they "connect" with the GDS via an LEF-pin to GDS-pin layer translation. The user may provide a GDS-LEF mapping table. This allows the foundry to do logic gate-level failure analysis as opposed to mask-level failure analysis. At the same time, the foundry is not privy to hierarchical design information, so they are tracing a "flat schematic" as opposed to the hierarchical/functional schematic. Flat schematic tracing is adequate for defect localization. The overlay or superposition of the physical targets on the GDS mask data aligns LEF-derived pin shapes with the GDS mask layer where the cell pins are fabricated. By mapping the LEF-pin layer to GDS-pin layer (e.g., LEF-pin layer name="M1", corresponding GDS pin layer name="MET1"), the failure analyst can trace nets at the logic gate level (cell type/pin name) instead of at the GDS mask level. In addition, these GDS nets are then annotated with the cell/pin name, which creates a much more meaningful history of traces.

Figure 8:
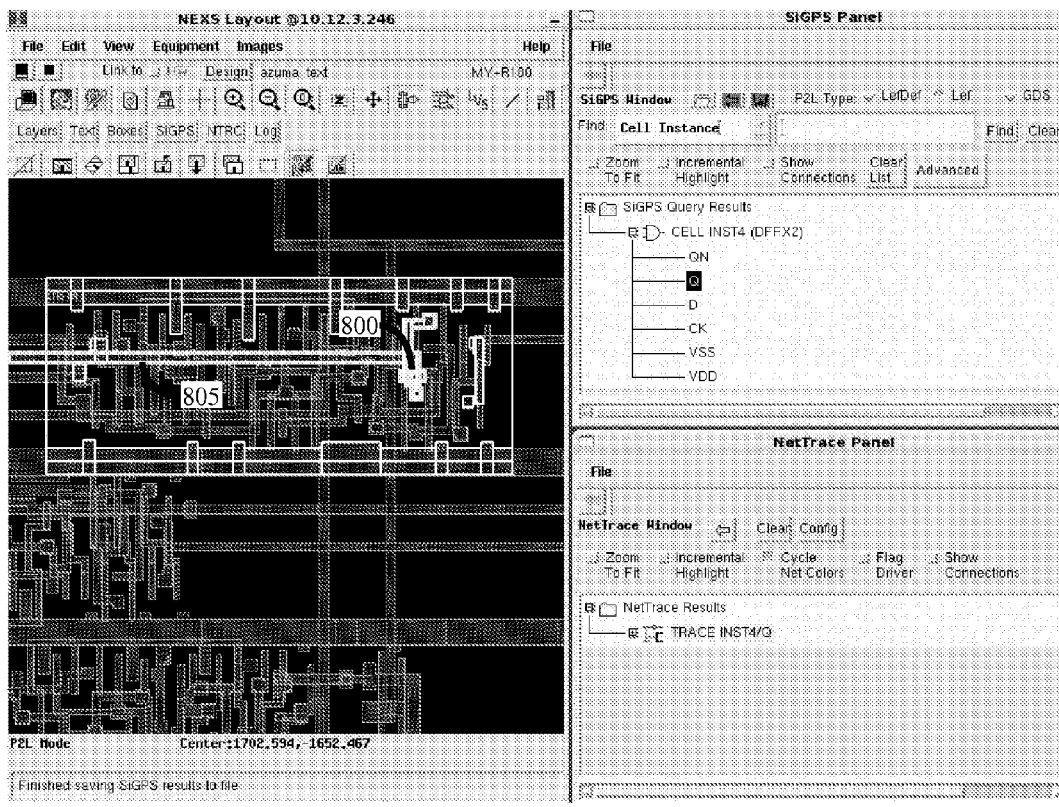
FIG. 8 shows an example of overlaying of physical targets on GDS nets.

FIG. 8 shows an example of overlaying of physical targets on GDS nets. Cell 800 which is highlighted is a physical target obtained as a query result from the cross-mapping database. Results of a gds-based net trace (DCG commercial name is "Nettrace") yields trace 805 which is highlighted. Tracing is done from the panel in the upper right, where logic gates are listed by cell type and can be expanded to show their pin-out. A pin's net is traced by selecting the pin's name, in this case "Q", and initiating a physical net trace. (in the DCG tool, the option to "trace physical net" is selected from a pull-down menu), resulting in physical net trace 805 in the GDS viewer.

Step 705 is similar to the alignment steps of the previous embodiment. The foundry performs a CAD alignment, which may be done using the GDS viewer (DCG commercial name is NEXS Layout tool,) and uses the physical targets to drive the stage to the region of interest on the failure analysis tool, which can use FA techniques including but not limited to: photoemission, time-resolved emission, laser voltage probing, laser voltage imaging, LADA. Because the physical targets represent, for example, a broken scan chain or the fault candidates from scan diagnosis, the area of interest from image/signal acquisition is well defined and reduced, which drastically improves the throughput of the analysis.

In step 710, failure analysis data is collected, e.g., cells are probed or emission is captured in the area around the physical targets overlay as described above.

In step 715, once failure analysis data is collected, further analysis may require identifying/highlighting additional cells around the "hot spots", e.g. thermal emission spots, photo emission spots, LVI signal abnormality. Without the cross-mapping database, which in this embodiment is not available to the foundry, additional cell/pin highlighting may be achieved by either of the following novel techniques:

In step 720, one option is to query the GDS database at an x,y location of interest to identify (i.e., name) and highlight the GDS cell structure (cell type). The cell bounding box is constructed and highlighted from the cell structure definition. An imaginary shape defining a region (for example, a square) is created around the center of the hot spot, and any GDS structures that overlap this square are found. If GDS text attach layers are included for the GDS metal layers that constitute pins, then a rectangle of the corresponding metal layer is drawn around each pin text label, so that net tracing can be abstracted to a higher level (by cell pin). This is achieved by using the rectangle as the seed layer and location to initiate the physical net trace. For instance, to trace the physical fan-out of a flip flop, as shown in FIG. 8, the user selects the "Q" pin in the cell's pin list 810, instead of zooming into the graphics to find the "Q" pin text, then tracing the net by selecting the polygon underneath the text.

In step 725, a second option is available if the foundry has the LEF files, i.e., the technology-specific cell libraries. In this case, then queries at a given x,y location in the GDS will identify the cell structure name, which is then translated to the LEF cell library name, and highlighting/labeling is done based on the LEF physical definition and pin names.

Figure 9:
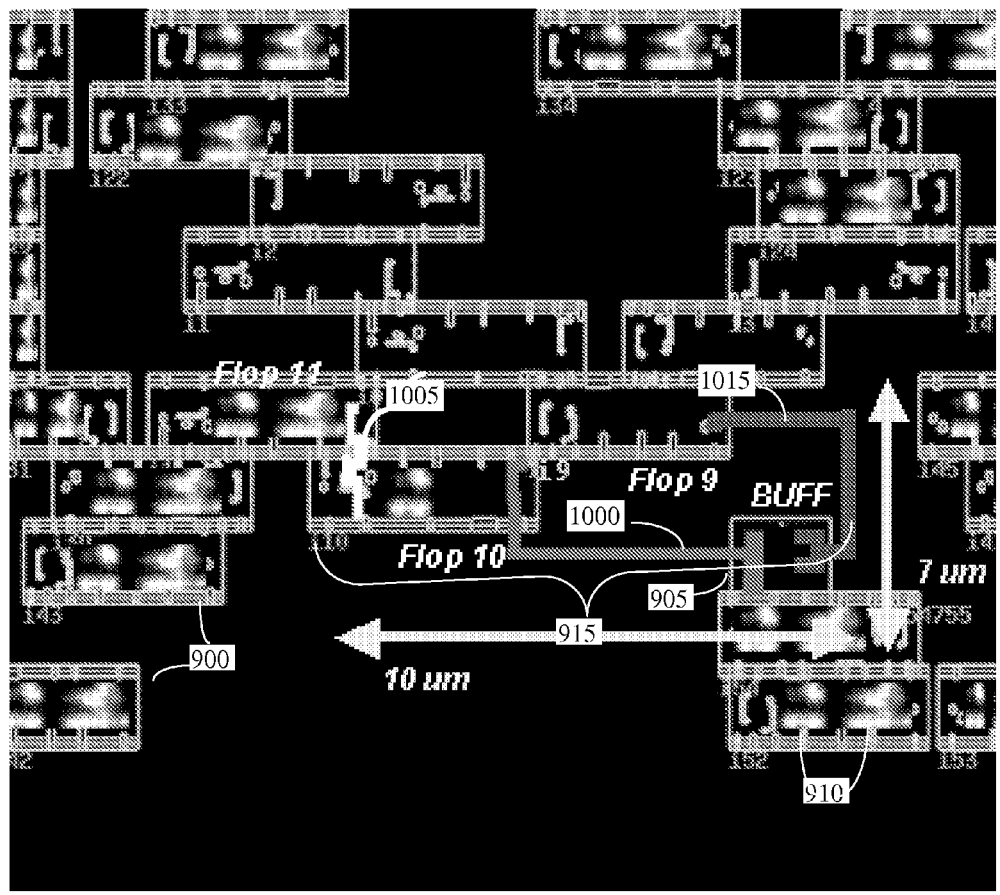
FIG. 9 shows an example of a logic path trace.

An example of FA using the methods described above is illustrated in FIGS. 9, 10, and 11. FIG. 9 shows an example of a logic path trace. Laser Voltage Imaging (LVI) can be used to isolate a broken flop. Highlighted cells 900 are scan chain flops derived from STIL, and provided by the design house. Cell 905 is highlighted in-situ at the foundry using a GDS-based cell query. This example illustrates that the LVI signal, shown as spots 910, is degrading in flop 10—half of the spots are missing. By tracing flop 10's logic path forward, through a buffer, which is dead (no LVI activity), an area is easily defined for physical failure analysis (PFA). The area 915 defining flop 10+buffer+flop 9 (the first completely dead flop) can be used as the region of interest for PFA.

Figure 10:
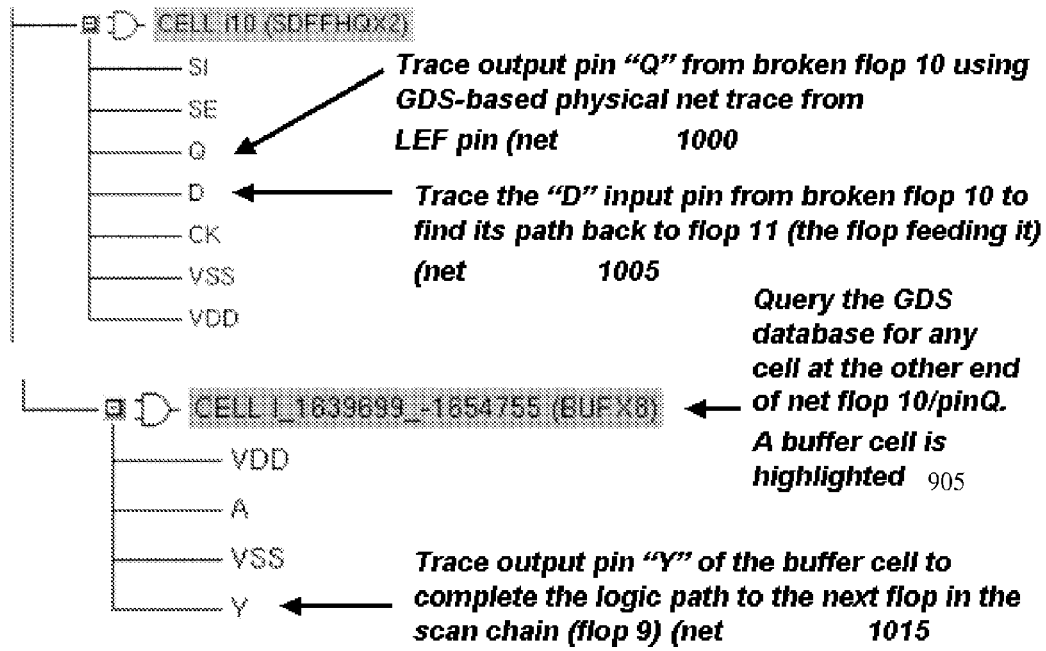
FIG. 10 shows the abstracting of the path tracing of FIG. 9.

FIG. 10 illustrates the abstracting of the path tracing:
a) Trace output pin "Q" from broken flop 10 using GDS-based physical net trace from LEF pin (net 1000)
b) Query the GDS database for any cell at the other end of net flop 10/pinQ. A buffer cell is highlighted 1010.
C) Trace output pin "Y" of the buffer cell to complete the logic path to the next flop in the scan chain (flop 9) (net 1015)

System Considerations

The inventive methods or portions thereof may be computer-implemented. The computer system may include a processor (e.g. a processor core, a microprocessor, a computing device, etc), memory which may include a main memory and a static memory, which communicate with each other via a bus. The machine may further include a display unit that may comprise a touch-screen, or a liquid crystal display (LCD), or a light emitting diode (LED) display, or a cathode ray tube (CRT). As shown, the computer system also may include a human input/output (I/O) device (e.g. a keyboard, an alphanumeric keypad, etc), a pointing device (e.g. a mouse, a touch screen, etc), a drive unit (e.g. a disk drive unit, a CD/DVD drive, a tangible computer readable removable media drive, an SSD storage device, etc), a signal generation device (e.g. a speaker, an audio output, etc), and a network interface device (e.g. an Ethernet interface, a wired network interface, a wireless network interface, a propagated signal interface, etc).

The drive unit may include a machine-readable medium on which is stored a set of instructions (i.e. software, firmware, middleware, etc) embodying any one, or all, of the methodologies described above. The set of instructions is also shown to reside, completely or at least partially, within the main memory and/or within the processor. The set of instructions may further be transmitted or received via the network interface device over the network bus to the network.

It is to be understood that embodiments of this invention may be used as, or to support, a set of instructions executed upon some form of processing core (such as the CPU of a computer) or otherwise implemented or realized upon or within a machine- or computer-readable medium. A machine-readable medium includes any mechanism for storing or transmitting information in a form readable by a machine (e.g. a computer). For example, a machine-readable medium includes read-only memory (ROM); random access memory (RAM); magnetic disk storage media; optical storage media; flash memory devices; electrical, optical, acoustical or other form of propagated signals (e.g. carrier waves, infrared signals, digital signals, etc); or any other type of media suitable for storing or transmitting information.

System Requirements

The invention includes apparatus for carrying out the described methods and methodology. Such apparatus preferably comprises a suitably-programmed and configured general-purpose data processing or computer system, such as that of data processing system or a CAD workstation system used to perform routing and layout of an IC. Data storage medium is included which may comprise disk storage. Data processing capability and displays which may be used for operator interface with the data processing system are further described in U.S. Pat. No. 5,675,499, which is hereby incorporated by reference.

The present invention provides a methodology for limiting the information transferred from a design facility to a fabrication or failure analysis facility to that which is necessary to perform the requested tasks. In this way, proprietary design information can often be retained by the design facility while not compromising the effectiveness of the failure analysis job. Through the methods disclosed herein, a foundry can do efficient defect localization and failure analysis using a combination of: Design house-generated physical maps obtained from diagnostics, simulations, etc., plus GDS and/or LEF-based cell/pin highlighting, coupled with GDS-based physical net tracing. This solution gives the foundry more efficiency and self-reliance in yield/failure analysis without having the design house compromise confidential design information.

It is not expected that the invention be limited to the exact embodiments described herein. Those skilled in the art will recognize that changes and modifications can be made without departing from the inventive concept. For example, the exact formats of the transferred files may vary. In addition, improvements may be made in the algorithms used to optimize edit points. The scope of the invention should be construed in view of the claims.

With this in mind, we claim:

1. A method for an integrated circuit (IC) design facility to transfer design and layout format to an external facility, for failure analysis or circuit edit of an IC chip, comprising the steps of:
- creating a GDS-based failure analysis (FA)-specific or circuit edit (CE)-specific physical target file by using a computer, said FA-specific or circuit edit-specific physical target file including minimum design-specific information required to enable effective failure analysis or circuit edit;
- configuring said GDS-based physical target file to enable said external facility to overlay said GDS-based physical target file on GDS mask data for said IC chip; and
- providing said GDS-based physical target file to said external facility;
- wherein said GDS-based physical target file is created by querying a cross-mapping database generated from LEF/DEF files; and
- wherein said LEF/DEF conversion to a cross-mapping database is done for DEF components only, omitting nets and special nets.

2. The method of claim 1, further including the step of generating physical targets in GDS format, using new mask layers for physical target bounding boxes and pin shapes.

3. The method of claim 2, further providing a pin layer name for each pin on the physical targets file.

4. The method of claim 2, further including the step of providing to the external facility means for displaying said physical target file within GDS mask file for said IC chip, to enable failure analysis by the external facility.

5. The method of claim 4, wherein said step of providing to the external facility means for displaying said physical target file within GDS mask file for said IC chip comprises:
- said external facility utilizing a custom GDS viewer which can read physical targets format.

6. The method of claim 4, wherein said step of providing to the external facility means for displaying said physical target file within GDS mask file for said IC chip comprises:
- using a query utility to generate physical targets in GDS format, using new mask layers for physical target bounding boxes and pin shapes;
- wherein said physical targets in GDS format can be merged with a full chip GDS file.

7. The method of claim 4, wherein said failure analysis includes:
- translating LEF-derived pin layer names to the corresponding layer name in the GDS mask, for the purpose of tracing nets in GDS using pins on the physical targets as starting points.

8. The method of claim 7, including tracing GDS nets from cell library pin labels.

9. The method of claim 7, wherein said failure analysis further includes highlighting cell structures within the GDS mask file.

10. The method of claim 7, further including using GDS text attach layers for GDS metal layers that constitute cell pins to initiate physical net tracing from said cell pins.

* * * * *